(12) United States Patent
Yang (10) Patent No.: US 9,374,049 B2
(45) Date of Patent: Jun. 21, 2016

(54) DIFFERENTIAL AMPLIFIER (71) Applicant: Hyundai Motor Company, Seoul (KR)

(72) Inventor: Sang-Hyeok Yang, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/555,783

(22) Filed: Nov. 28, 2014

(65) Prior Publication Data

US 2015/0171807 A1   Jun. 18, 2015

(30) Foreign Application Priority Data

Dec. 18, 2013 (KR) ........................ 10-2013-0158648

(51) Int. Cl.
*H03F 3/45* (2006.01)
(52) U.S. Cl.
CPC .. *H03F 3/45475* (2013.01); *H03F 2203/45511* (2013.01); *H03F 2203/45512* (2013.01); *H03F 2203/45528* (2013.01); *H03F 2203/45544* (2013.01)
(58) Field of Classification Search
CPC ........................................................ H03F 3/45
USPC .................................... 330/69, 260
See application file for complete search history.

(56) References Cited

U.S. PATENT DOCUMENTS

| 7,564,307 | B2* | 7/2009 | Hunter | H03F 3/45475 |
| | | | | 330/258 |
| 8,441,287 | B2* | 5/2013 | Chatterjee | H03F 3/45071 |
| | | | | 327/94 |
| 8,610,497 | B2* | 12/2013 | Kropfitsch | H03F 1/56 |
| | | | | 330/109 |
| 2009/0322920 | A1 | 12/2009 | Terzioglu | |
| 2010/0171554 | A1 | 7/2010 | Schauer et al. | |

FOREIGN PATENT DOCUMENTS

| KR | 10-2012-0022950 A | 3/2012 |
| KR | 10-2013-0009666 A | 1/2013 |
| KR | 10-2013-0059995 A | 6/2013 |

* cited by examiner

*Primary Examiner* — Henry Choe
(74) *Attorney, Agent, or Firm* — Mintz Levin Cohn Ferris Glovsky and Popeo, P.C.; Peter F. Corless (57) ABSTRACT

Provided is a differential amplifier including: an operational amplifier (OP AMP) having an inverting input, a non-inverting input, an inverting output, and a non-inverting output, a first feedback capacitor connected to the non-inverting input and the inverting output. A second feedback capacitor connected to the inverting input and the non-inverting output, a first four-terminal transistor connected to the non-inverting input and the inverting output. A second four-terminal transistor connected to the inverting input and the non-inverting output. One of source and drain of the first transistor and a gate thereof are connected to the inverting output, the other one of the source and drain and a bulk terminal are connected to the non-inverting input, one of source and drain of the second transistor and a gate thereof are connected to the non-inverting output, and the other one of the source and drain terminals and a bulk terminal are connected to the inverting input.

5 Claims, 8 Drawing Sheets

RELATED ART

FIG. 5

RELATED ART

DIFFERENTIAL AMPLIFIER

CROSS-REFERENCE TO RELATED APPLICATION(S)

Pursuant to 35 U.S.C. §119(a), this application claims priority to Korean Patent Application No. 10-2013-0158648 filed on Dec. 18, 2013, the entire contents of which are incorporated herein by reference.

BACKGROUND

1. Field of the Invention

The present invention relates to a differential amplifier, and more particularly, to a capacitive feedback fully-differential amplifier.

2. Discussion of the Related Art

Currently, amplifiers are being used in various electronic circuits, and such amplifiers may be used in various electronic devices. One type of amplifier used in such various electronic devices is a differential amplifier, which incorporates a resistive feedback structure and a capacitive feedback structure. Problems involved in differential amplifiers having a resistive feedback structure, include that a direct current (DC) offset is amplified in the output.

In contrast, the capacitive feedback structure has an advantage over the resistive feedback structure in that the capacitive feedback structure transmits and amplifies an alternating current (AC) signal while blocking direct current (DC) components. However, when capacitors are connected to the differential amplifier having a capacitive feedback structure, floating nodes may be generated since amplifying terminals are formed. In a floating node, since its potential is not fixed and varies based on the surrounding environment, output of the differential amplifier varies due to the non-fixed (variable) floating node.

In the related art, in order to fix the voltage of the floating node, a resistor having very high resistance may be connected to an output terminal for feedback. In particular, since the resistor having very high resistance does not affect the output of the amplifying terminal when the resistance is at least about 1 giga-ohm, a substantial area is required to acquire such a high resistance, thereby making implementation of such an amplifier difficult using a sub-micron complementary metal oxide semiconductor (CMOS) process.

The above information disclosed in this background section is merely for enhancement of understanding of the background of the invention and therefore it may contain information that does not form the prior art that is already known in this country to a person of ordinary skill in the art.

SUMMARY

The present invention provides a differential amplifier which may include an operational amplifier (OP AMP) having an inverting input terminal, a non-inverting input terminal, an inverting output terminal, and a non-inverting output terminal; a first feedback capacitor connected to the non-inverting input terminal and the inverting output terminal of the OP AMP; a second feedback capacitor connected to the inverting input terminal and the non-inverting output terminal of the OP AMP; a first transistor having four terminals and connected to the non-inverting input terminal and the inverting output terminal of the OP AMP; and a second transistor having four terminals and connected to the inverting input terminal and the non-inverting output terminal of the OP AMP.

One of source and drain terminals of the first transistor and a gate terminal thereof may be connected to the inverting output terminal of the OP AMP, the other one of the source and drain terminals and a bulk terminal may be connected to the non-inverting input terminal of the OP AMP, one of source and drain terminals of the second transistor and a gate terminal thereof may be connected to the non-inverting output terminal of the OP AMP, and the other one of the source and drain terminals and a bulk terminal may be connected to the inverting input terminal of the OP AMP. The first and second transistors may be P-type metal oxide semiconductor (PMOS) transistors. The source and drain terminals of the first and second transistors may be respectively connected to a pair of P regions that are formed by injecting a p-type dopant onto an N-type semiconductor substrate.

The first and second transistors may be formed with channels between the pair of P regions and include gate terminals that protrude above the channels. The first and second transistors may have bulk regions on the N-type semiconductor substrate that are connected to the bulk terminals. The differential amplifier may further include a first input terminal capacitor connected between the non-inverting input terminal of the OP AMP and the non-inverting input terminal of the differential amplifier; and a second input terminal capacitor connected between the inverting input terminal of the OP AMP and the inverting input terminal of the differential amplifier.

A pair of floating nodes may be respectively disposed between the first input terminal capacitor and the non-inverting input terminal of the OP AMP and between the second input terminal capacitor and the inverting input terminal of the OP AMP. The other one of the source and drain terminals of the first transistor and the bulk terminal thereof may be connected to a first node of the pair of floating nodes, and the other one of the source and drain terminals of the second transistor and the bulk terminal thereof may be connected to the second node of the pair of floating nodes. The first node of the pair of floating nodes may be connected to the first feedback capacitor, and the second node of the pair of floating nodes may be connected to the second feedback capacitor.

As described above, the four-terminal transistors may be formed in parallel with the capacitive feedback terminals of the differential amplifier, and one of source and drain terminals of each four-terminal transistor and the bulk terminal thereof may be connected to the floating node while the other two terminals may be connected to the output terminal of the differential amplifier, thereby stabilizing the voltages of the floating nodes and reducing the time for stabilizing them. In addition, elements used for stabilizing the floating node may be formed on the semiconductor substrate as the PMOS transistor, thereby reducing the forming area.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiments are described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The present invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
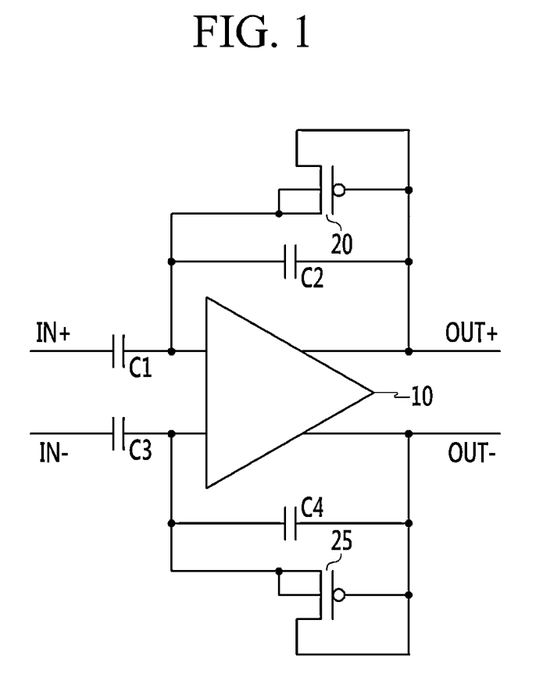
FIG. 1 is an exemplary circuit diagram of a differential amplifier according to an exemplary embodiment of the present invention.

FIG. 1 is an exemplary circuit diagram of a differential amplifier according to an exemplary embodiment of the present invention. The differential amplifier illustrated in FIG. 1 is a capacitive feedback fully-differential amplifier. The capacitive feedback fully-differential amplifier may include an operational amplifier (OP AMP) 10, first to fourth capacitors C1, C2, C3, and C4, and first and second transistors 20 and 25. The differential amplifier has two input terminals IN+ and IN− and two output terminals OUT+ and OUT−. The non-inverting input terminal IN+ of the differential amplifier may be connected to one end of the first capacitor C1, and the inverting input terminal IN− of the differential amplifier may be connected to one end of the third capacitor C3. The OP AMP 10 has two input terminals (+, −) and two output terminals (+, −).

Further, the inverting output terminal (−) of the OP AMP 10 may be directly connected to the inverting output terminal (OUT−) of the differential amplifier, and the non-inverting output terminal (+) of the OP AMP 10 may be directly connected to the non-inverting output terminal (OUT+) of the differential amplifier. The non-inverting input terminal (+) and the inverting output terminal (−) of the OP AMP 10 may be connected by the second capacitor C2 to have a feedback structure, and the inverting input terminal (−) and the non-inverting output terminal (+) may be connected by the fourth capacitor C4 to have a feedback structure. The second capacitor is referred to as a first feedback capacitor, and the fourth capacitor is referred to as a second feedback capacitor.

The non-inverting input terminal (+) of the OP AMP 10 may be connected to the other end (e.g., a second end) of the first capacitor C1, and the inverting input terminal (−) may be connected to the other end (e.g., a second end) of the third capacitor C3. The first capacitor C1 is referred to as a first input terminal capacitor, and the third capacitor C3 is referred to as a second input terminal capacitor. A first floating node is present between the non-inverting input terminal (+) of the OP AMP 10 and the other end of the first capacitor C1, and may be connected to the second capacitor C2.

However, the exemplary embodiment illustrated in FIG. 1 has a structure in which the first floating node is not floated by the first transistor 20. In other words, along with the second capacitor C2, the first transistor 20 may connect the non-inverting input terminal (+) and the inverting output terminal (−) of the OP AMP 10. In other words, the second capacitor C2 and the first transistor 20 may be connected in parallel. The first transistor 20 may be a PMOS transistor having four terminals, wherein the gate and source terminals thereof may be connected to the inverting output terminal (−) of the OP AMP 10, and the bulk and drain terminals thereof may be connected to the non-inverting input terminal (+) of the OP AMP 10.

However, in some exemplary embodiments, the source terminal of the first transistor 20 may be connected to the non-inverting input terminal (+) of the OP AMP 10 and the drain terminal may be connected to the inverting output terminal (−) of the OP AMP 10 (not shown). In other words, one of the source and drain terminals of the first transistor 20 and the gate terminal thereof may be connected to the inverting output terminal (−) of the OP AMP 10, and the other terminals may be connected to the non-inverting input terminal (+) of the OP AMP 10 in such an exemplary embodiment.

A second floating node is present between the inverting input terminal (−) of the OP AMP 10 and the other end (e.g., a second end) of the third capacitor C3, and may be connected to the fourth capacitor C4. However, the present exemplary embodiment has a structure in which the second floating node is not floated by the second transistor 25. In other words, along with the fourth capacitor C4, the second transistor 25 may connect the inverting input terminal (−) of the OP AMP 10 and the non-inverting output terminal (+). Additionally, the fourth capacitor C4 and the second transistor 25 may be connected in parallel. The second transistor 25 may be a PMOS transistor having four terminals; wherein gate and source terminals thereof may be connected to the non-inverting output terminal (+) of the OP AMP 10, and bulk and drain terminals thereof may be connected to the inverting input terminal (−) of the OP AMP 10.

However, in some exemplary embodiments, the source terminal of the second transistor 25 may be connected to the inverting input terminal (−) of the OP AMP 10 and the drain terminal may be connected to the non-inverting output terminal (+) of the OP AMP 10. In other words one of the source and drain terminals of the second transistor 25 and the gate terminal thereof may be connected to the non-inverting output terminal (+) of the OP AMP 10 (not shown), and the other terminals may be connected to the inverting input terminal (−) of the OP AMP 10 in such an exemplary embodiment.

Figure 2:
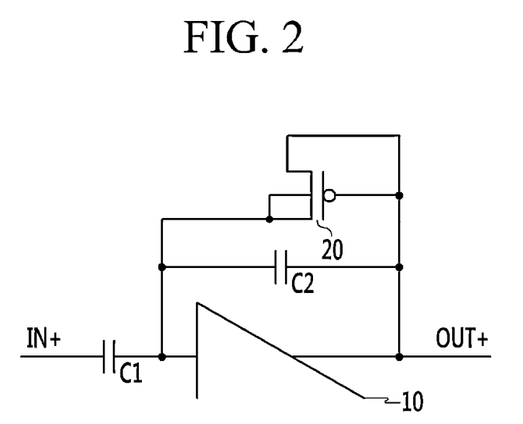
FIG. 2 is an exemplary enlarged view of one side of the differential amplifier according to an exemplary embodiment of the present invention.
Figure 3:
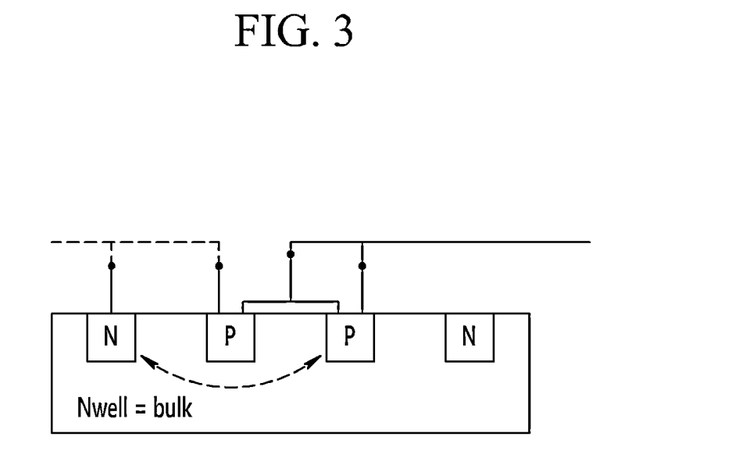
FIG. 3 is an exemplary cross-sectional view of a 4-port transistor according to an exemplary embodiment of the present invention.

Among the structure of the differential amplifier described above, the structure of one side (e.g., a first side) of the differential amplifier (the inverting output terminal (−) and the non-inverting input terminal (+) of the OP AMP) will now be described in more detail with reference to FIGS. 2 and 3. FIG. 2 is an exemplary enlarged view of one side of a differential amplifier according to the exemplary embodiment of the present invention as illustrated in FIG. 1, and FIG. 3 is an exemplary cross-sectional view of a 4-port transistor according to an exemplary embodiment of the present invention. The structure of FIG. 2 illustrates the inverting output terminal (−) and the non-inverting input terminal (+) of the OP AMP illustrated in FIG. 1.

The structure illustrated in FIG. 2 may include a first transistor 20 for stabilizing the first floating node, and an exemplary structure of the first transistor 20 is illustrated in FIG. 3. The first and second transistors 20 and 25 may be PMOS transistors. When the first and second transistors 20 and 25 are PMOS transistors, source and drain regions of the first transistor 20 are formed in a pair of P regions formed by injecting a p-type dopant injected into an N-type semiconductor substrate. A channel of the first transistor 20 is formed between the source and drain regions, and the gate terminal is formed at one side (e.g., a first side) of the channel.

The exemplary embodiment of FIG. 3 has a structure in which the gate terminal protrudes upwardly. In an N region, which is a partial portion of the N-type semiconductor substrate, a bulk region is connected to the bulk terminal. As illustrated in FIG. 3, one terminal connected to one of the source and drain regions and the bulk terminal connected to the bulk region are connected to each other, and the other two terminals may be connected to each other. In particular, one of the source and drain terminals and the gate terminal may be connected to the inverting output terminal (−) of the OP AMP 10, and the other terminals may be connected to the non-inverting input terminal (+) of the OP AMP 10. As shown in FIG. 3, an initial voltage may be increased in one of the source and drain terminals and the gate terminal, and an initial low voltage may be applied to the other one of the source and drain terminals and the bulk terminal. As a result, in the first transistor 20, a forward current, due to a P-N junction, flows between one P-type region connected to the same terminal as the gate terminal and the bulk region.

Accordingly, a voltage of the first floating node may be rapidly stabilized by the first transistor 20. As shown in the structure of FIG. 3, space is not a concern since the first transistor 20 may be formed using the semiconductor substrate having a reduced size. Characteristics of the differential amplifier according to the present invention will be described later in FIGS. 8 and 9, but prior to describing the characteristics, structures of the differential amplifiers according to the related art will be briefly described and the characteristics therebetween will then be compared.

Figure 4:
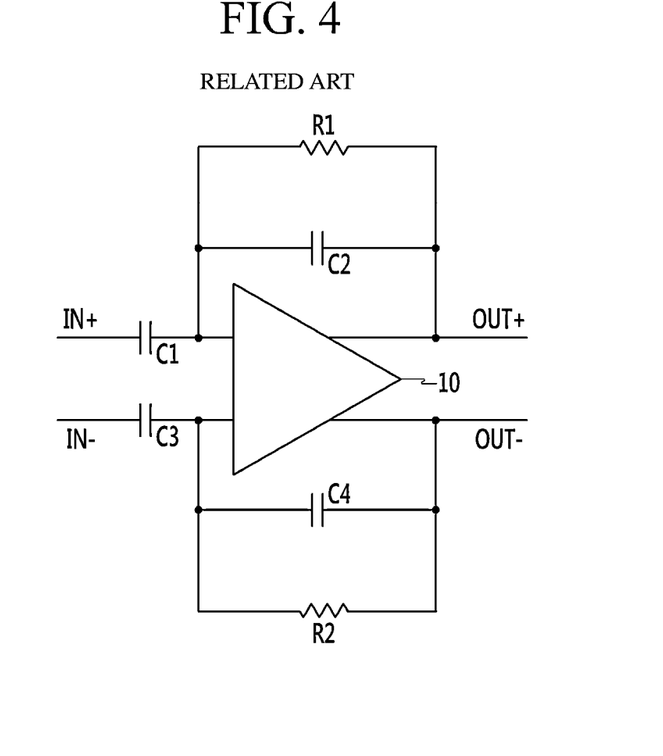
FIGS. 4 and 5 are exemplary circuit diagrams of differential amplifiers according to the related art.
Figure 5:
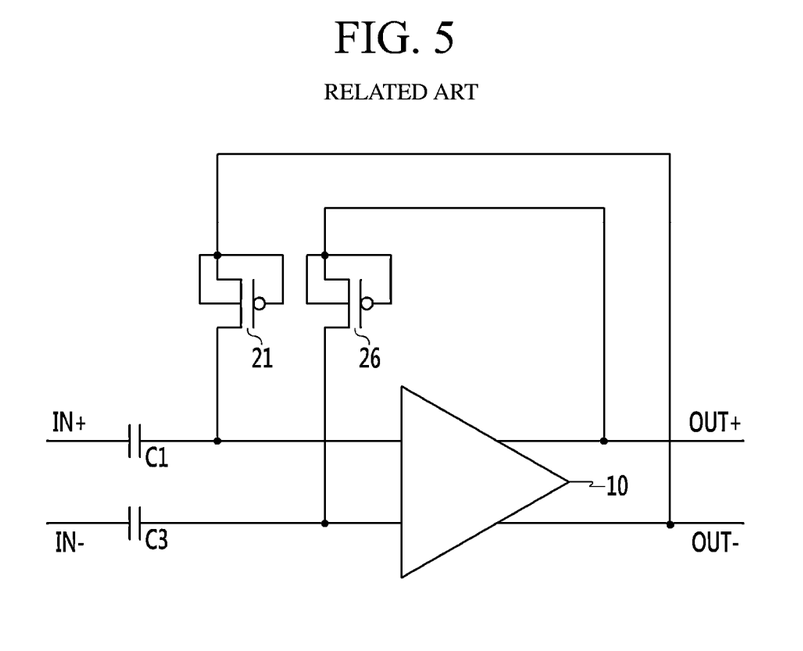

FIGS. 4 and 5 are exemplary circuit diagrams of differential amplifiers according to the related art. FIG. 4 illustrates a structure in which resistors are used to stabilize a floating node using the differential amplifier according to the related art. The structure of FIG. 4 differs from that of FIG. 1 in that the FIG. 4 structure uses the resistors. In particular, since the resistor used should have resistance of at least 1 giga-ohm to ensure that it has no effect on an output of an amplifying stage, a large area of a wafer is required to form such a resistor, thereby making such a structure difficult to implement in a sub-micron CMOS process.

Similar to the exemplary embodiment of the present invention, the conventional art differential amplifier of FIG. 5 uses transistors 21 and 26 to stabilize the floating node. However, three of four terminals of each transistor are connected to one side of the differential amplifier of FIG. 5, and the other terminal is connected to the other side. Further, the structure of FIG. 5 does not include capacitors that are connected to the output and input terminals. The characteristics of the differential amplifier according to the structure of FIG. 5 are illustrated in FIGS. 6 and 7.

Figure 6:
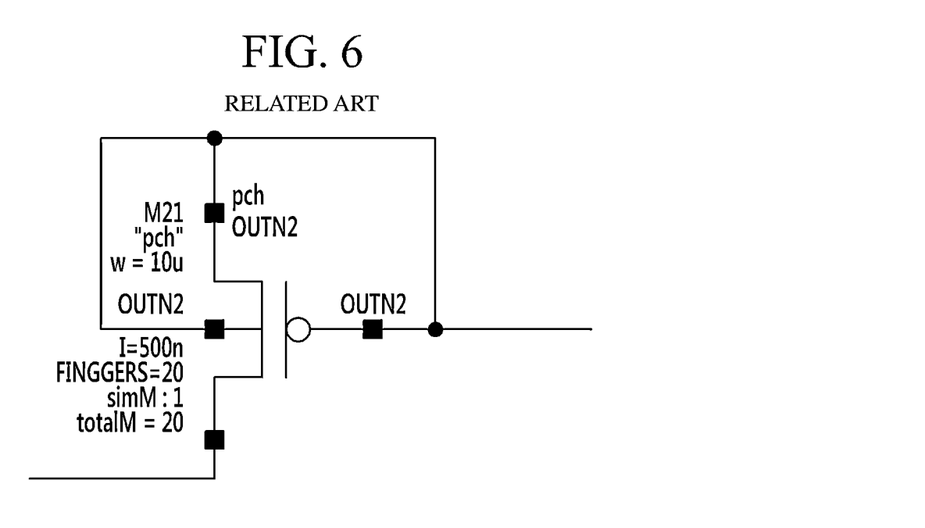
FIGS. 6 and 7 are exemplary drawings illustrating simulated voltage stabilization of a floating node using the differential amplifier of FIG. 5.
Figure 7:
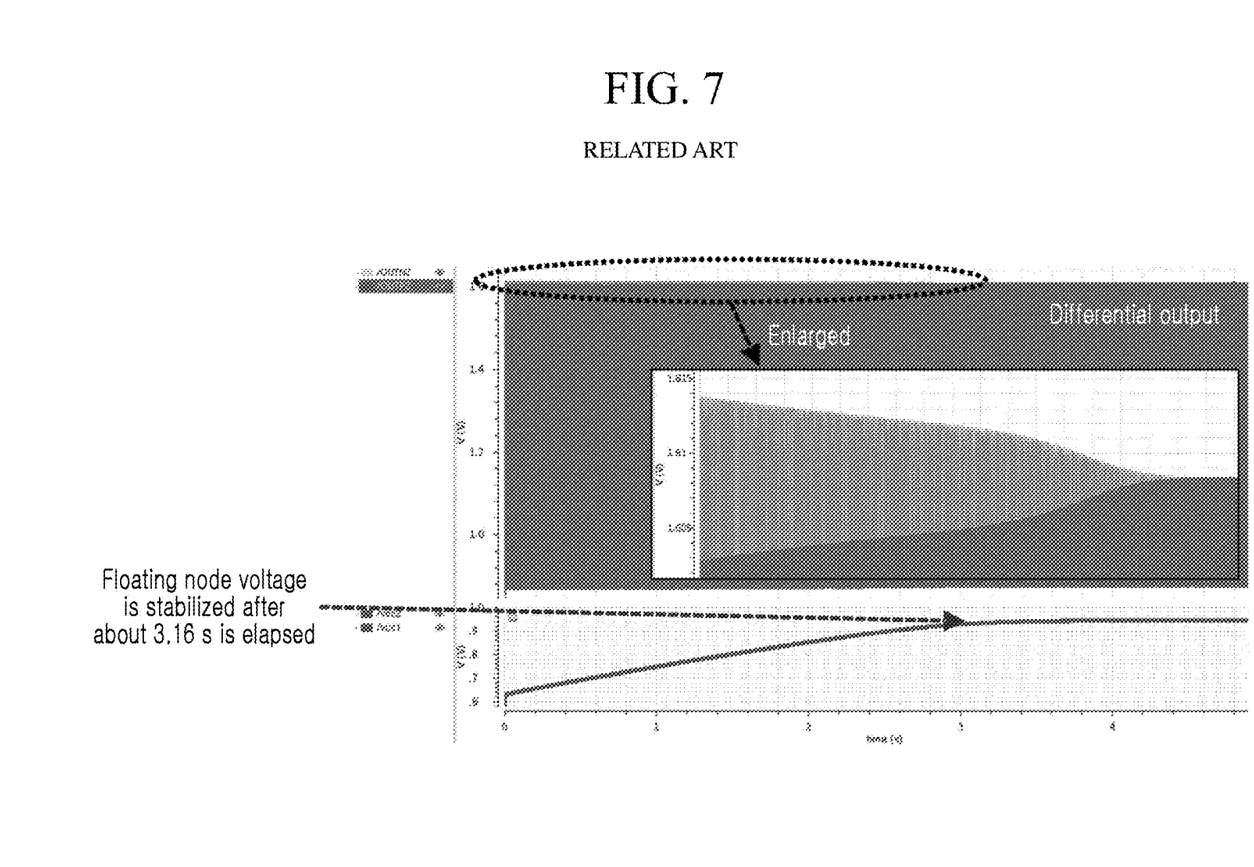

FIGS. 6 and 7 are exemplary drawings illustrating simulated voltage stabilization of the floating node using the differential amplifier of FIG. 5. First, for simulation, the characteristics of the transistor in the differential amplifier of FIG. 5 are set as shown in FIG. 6. A simulation result is illustrated in FIG. 7. According to FIG. 7, stabilization of the floating node of the differential amplifier takes about 3.16 seconds. Since this is substantial period of time for initializing the differential amplifier, errors may occur.

Figure 8:
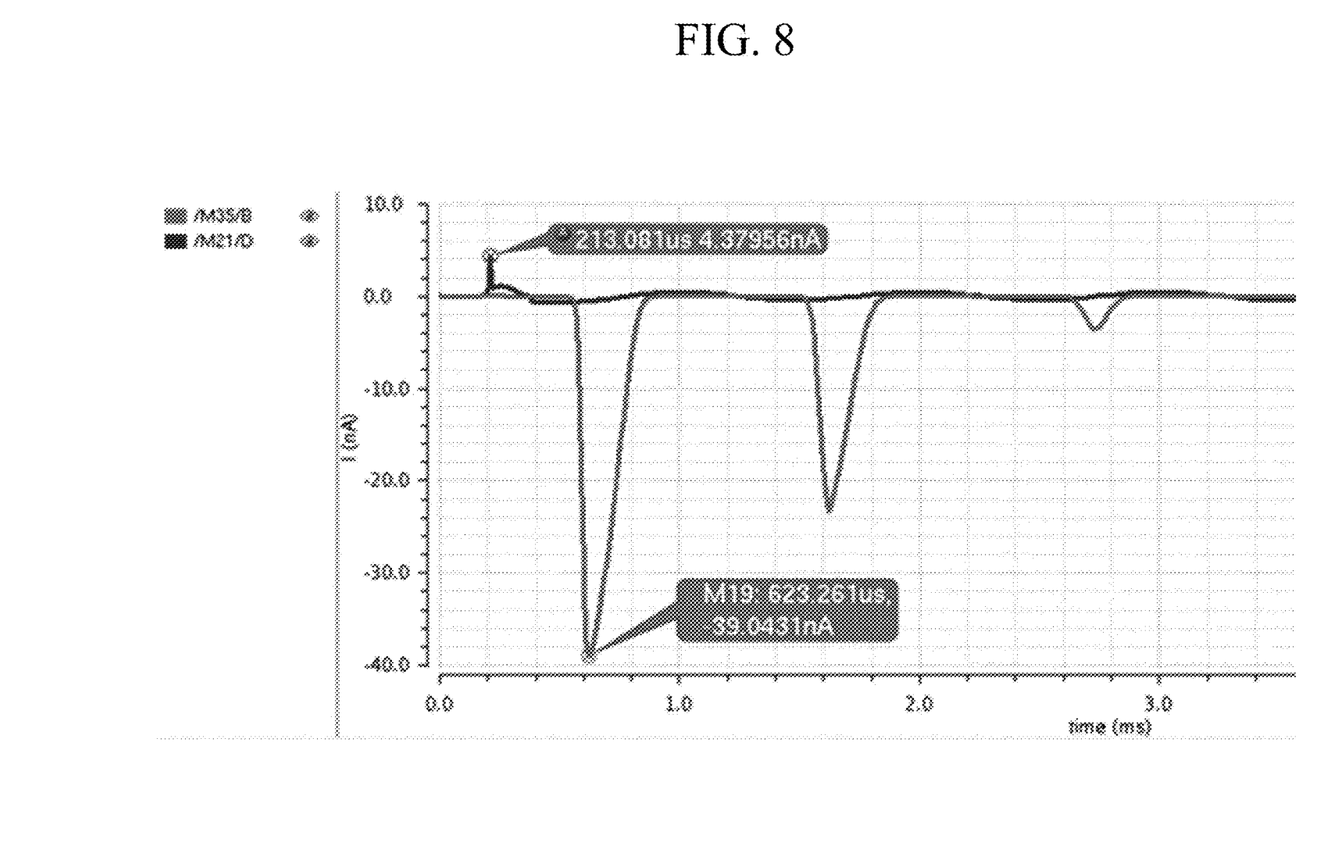
FIGS. 8 and 9 are exemplary drawings of a simulated result of voltage stabilization of the differential amplifier according to an exemplary embodiment of the present invention.
Figure 9:
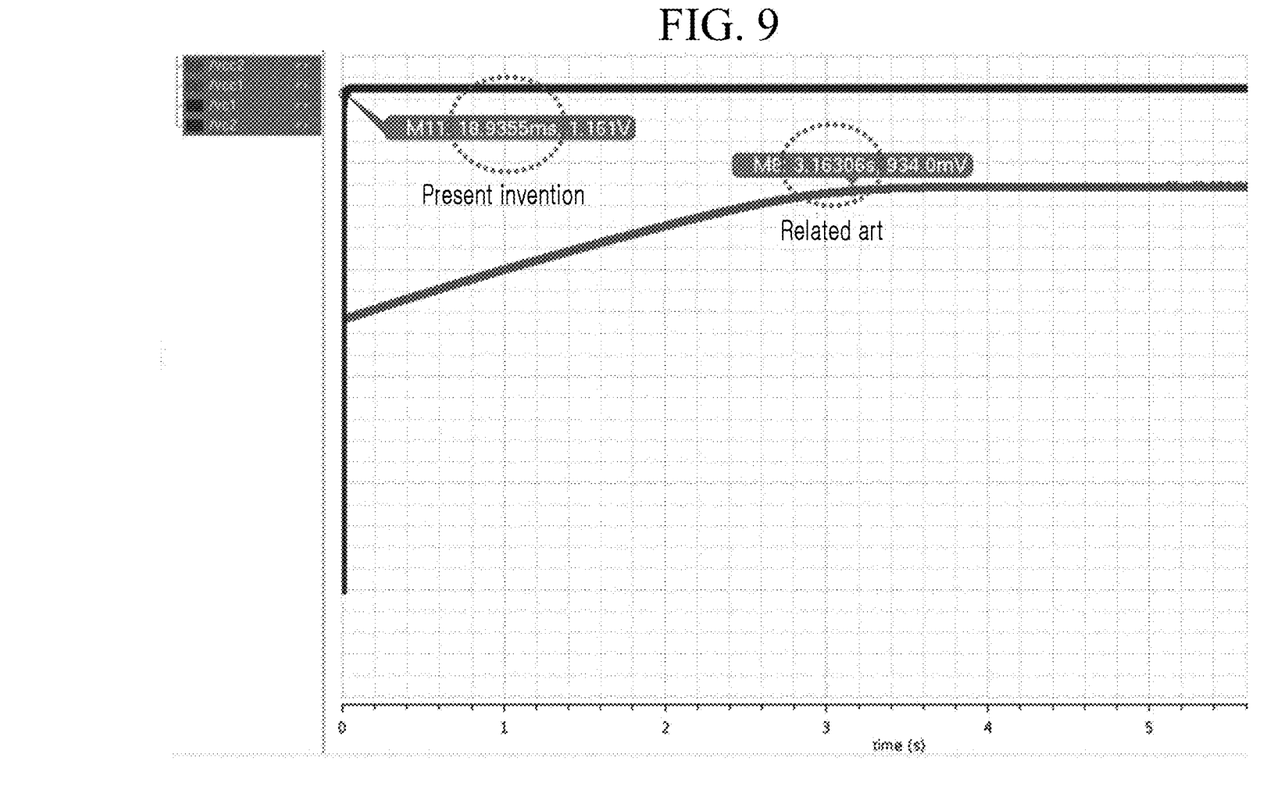

The characteristics of the differential amplifier according to the exemplary embodiment of the present invention illustrated in FIG. 1 and the characteristics of the differential amplifier of FIG. 5 will now be comparatively described in FIGS. 8 and 9. FIGS. 8 and 9 are exemplary drawings of a simulated result of voltage stabilization of the differential amplifier according to the exemplary embodiment of the present invention. FIG. 8 illustrates variation of an initial current flowing through the transistors. In FIG. 8, the curve labeled M35/B represents the differential amplifier of FIG. 5 (of the conventional art), and shows that a maximum current of about 4.38 nA initially flows. In FIG. 8, the curve labeled M21/D has a maximum current of about 39.04 nA.

Additionally, FIG. 8 shows the M21/D curve according to the present invention has a longer, more constantly maintained period from the start than the curve labeled M35/B according to the related art, and the overall current of the conventional art continuously varies, while the curve of the present invention (M21/D), except for a position where the current flows, it can be seen that the current is more stably maintained for a substantial period of time and thus may be applied more constantly.

Similarly, the time for stabilizing the voltage of the floating node is illustrated in FIG. 9 based on variation of the current as shown in FIG. 8. A horizontal axis represents time, and a vertical axis represents the voltage of the floating node. In FIG. 9, curve M11 represents time to stabilization in the exemplary embodiment of the present invention of FIG. 1, and curve M8 represents time to stabilization in the conventional art differential amplifier of FIG. 5. As illustrated in FIG. 9, it takes more than about 3 seconds for the conventional art differential amplifier of FIG. 5 to stabilize the floating node, but it takes only about 18 ms for the differential amplifier according to the exemplary embodiment of the present invention of FIG. 1 to stabilize the floating node. Thus, the differential amplifier according to the exemplary embodiment of the present invention has an advantage of more rapidly stabilizing the floating node.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

10: OP AMP
20: first transistor
25: second transistor
C1, C2, C3, C4: capacitor

What is claimed is:

1. A differential amplifier comprising:
an operational amplifier (OP AMP) having an inverting input terminal, a non-inverting input terminal, an inverting output terminal, and a non-inverting output terminal;
a first feedback capacitor connected to the non-inverting input terminal and the inverting output terminal of the OP AMP;
a second feedback capacitor connected to the inverting input terminal and the non-inverting output terminal of the OP AMP;
a first transistor having four terminals and connected to the non-inverting input terminal and the inverting output terminal of the OP AMP, wherein the four terminals include a source terminal, a drain terminal, a gate terminal and a bulk terminal; and
a second transistor having four terminals and connected to the inverting input terminal and the non-inverting output terminal of the OP AMP, wherein the four terminals include a source terminal, a drain terminal, a gate terminal and a bulk terminal,
wherein one of the source and drain terminals of the first transistor and a gate terminal thereof are connected to the inverting output terminal of the OP AMP, and the other one of the source and drain terminals and the bulk terminal are connected to the non-inverting input terminal of the OP AMP, and
one of the source and drain terminals of the second transistor and a gate terminal thereof are connected to the non-inverting output terminal of the OP AMP, and the other one of the source and drain terminals and a bulk terminal are connected to the inverting input terminal of the OP AMP;
wherein the first and second transistors are PMOS transistors, the source and drain terminals of the first and second transistors are respectively connected to a pair of P regions that are formed by injecting a p-type dopant into an N-type semiconductor substrate, the first and second transistors are formed with channels between the pair of P regions and include gate terminals that protrude above the channels, and the first and second transistors include bulk regions on the N-type semiconductor substrate that are connected to the bulk terminals.

2. The differential amplifier of claim 1, further comprising:
a first input terminal capacitor connected between the non-inverting input terminal of the OP AMP and the non-inverting input terminal of the differential amplifier; and
a second input terminal capacitor connected between the inverting input terminal of the OP AMP and the inverting input terminal of the differential amplifier.

3. The differential amplifier of claim 2, wherein first and second floating nodes are respectively disposed between the first input terminal capacitor and the non-inverting input terminal of the OP AMP and between the second input terminal capacitor and the inverting input terminal of the OP AMP.

4. The differential amplifier of claim 3, wherein the other one of the source and drain terminals of the first transistor and the bulk terminal thereof are connected to one of the first and second floating nodes, and the other one of the source and drain terminals of the second transistor and the bulk terminal thereof are connected to the other one of the first and second floating nodes.

5. The differential amplifier of claim 4, wherein one of the first and second floating nodes is connected to the first feedback capacitor, and the other one of the first and second floating nodes is connected to the second feedback capacitor.

* * * * *